United States Patent
Cheng et al.

(10) Patent No.: US 9,455,141 B2
(45) Date of Patent: Sep. 27, 2016

(54) SILICON-GERMANIUM FIN OF HEIGHT ABOVE CRITICAL THICKNESS

(71) Applicant: GLOBALFOUNDRIES INC., Grand Cayman (KY)

(72) Inventors: Kanggou Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: GlobalFoundries, Inc., Grand Cayman (KY)

(*) Notice: Subject to any disclaimer, the term of this patent is extended or adjusted under 35 U.S.C. 154(b) by 0 days.

(21) Appl. No.: 14/574,533

(22) Filed: Dec. 18, 2014

(65) Prior Publication Data
US 2016/0181095 A1 Jun. 23, 2016

(51) Int. Cl.
| | |
|---|---|
| H01L 21/02 | (2006.01) |
| H01L 29/66 | (2006.01) |
| H01L 29/161 | (2006.01) |
| H01L 29/06 | (2006.01) |

(52) U.S. Cl.
CPC ..... *H01L 21/02532* (2013.01); *H01L 21/0245* (2013.01); *H01L 21/02422* (2013.01); *H01L 21/02587* (2013.01); *H01L 21/02612* (2013.01); *H01L 29/0653* (2013.01); *H01L 29/0657* (2013.01); *H01L 29/161* (2013.01); *H01L 29/66795* (2013.01)

(58) Field of Classification Search
CPC .................................................. H01L 21/02532
USPC ......................................................... 257/616
See application file for complete search history.

(56) References Cited

U.S. PATENT DOCUMENTS

| | | |
|---|---|---|
| 6,458,662 B1 | 10/2002 | Yu |
| 7,871,873 B2 | 1/2011 | Maszara et al. |
| 8,211,772 B2 | 7/2012 | Kavalieros et al. |
| 8,420,464 B2 | 4/2013 | Basker et al. |
| 8,420,471 B2 | 4/2013 | Anderson et al. |
| 8,703,565 B2 | 4/2014 | Chang et al. |

*Primary Examiner* — Anthony Ho
(74) *Attorney, Agent, or Firm* — Hoffman Warnick LLC; Yuanmin Cai

(57) ABSTRACT

Embodiments of the invention include a method for fabricating a SiGe fin and the resulting structure. A SOI substrate is provided, including at least a silicon layer on top of a BOX. At least one fin upon a thin layer of silicon and a hard mask layer over the at least one fin is formed using the silicon layer on top of the BOX. A SiGe layer is epitaxially grown from exposed portions of the fin and the thin layer of silicon. Spacers are formed on sidewalls of the hard mask. Regions of the SiGe layer and the thin layer of silicon not protected by the spacers are etched, such that portions of the BOX are exposed. A condensation process converts the fin to SiGe and to convert the SiGe layer to oxide. The hard mask, the spacers, and the oxide layer are removed.

14 Claims, 4 Drawing Sheets

SILICON-GERMANIUM FIN OF HEIGHT ABOVE CRITICAL THICKNESS

BACKGROUND OF THE INVENTION

The present invention relates generally to the field of the fabrication of semiconductor devices, and more particularly to the fabrication of a SiGe fin with a height above the critical thickness of SiGe.

Field-effect transistors (FETs) can be semiconductor devices fabricated on a bulk semiconductor substrate or on a silicon on insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain, thereby controlling the current flow between the source and the drain. Integrated circuit designs use complementary metal-oxide-semiconductor (CMOS) technology that use complementary and symmetrical pairs of p-type and n-type metal-oxide-semiconductor field-effect transistors (MOSFETs) for logic functions.

A FinFET is a non-planar FET. The "fin" is a narrow, vertical base channel between the source and the drain. The fin is covered by a thin gate oxide and surrounded on two or three sides by an overlying gate structure.

Silicon-germanium (SiGe) is a general term for the alloy $Si_{1-x}Ge_x$, which consists of any molar ratio of silicon (Si) and germanium (Ge). SiGe is manufactured on silicon wafers using conventional silicon processing toolsets.

SUMMARY

Embodiments of the invention include a method for fabricating a silicon germanium (SiGe) fin and the resulting structure. The method can include providing a silicon on insulator (SOI) substrate, wherein the SOI substrate includes at least a silicon layer on top of a buried oxide layer (BOX). The method can also include forming, using the silicon layer on top of the BOX, at least one fin upon a thin layer of silicon and a hard mask layer over the at least one fin. The method can also include epitaxially growing a SiGe layer from exposed portions of the at least one fin and the thin layer of silicon. The method can also include forming one or more spacers on one or more sidewalls of the hard mask layer. The method can also include etching regions of the SiGe layer and the thin layer of silicon not protected by the one or more spacers, such that portions of the BOX are exposed. The method can also include performing a condensation process to convert the at least one fin to SiGe and to convert the SiGe layer to oxide. The method can also include removing the hard mask layer, the one or more spacers, and the oxide layer.

Embodiments of the invention include a semiconductor structure. The semiconductor structure may include a BOX. The semiconductor structure may also include at least one fin upon the BOX, wherein the at least one fin is of a SiGe composition, and wherein the at least one fin has a height greater than a critical thickness of the SiGe composition.

DETAILED DESCRIPTION

Figure 1:
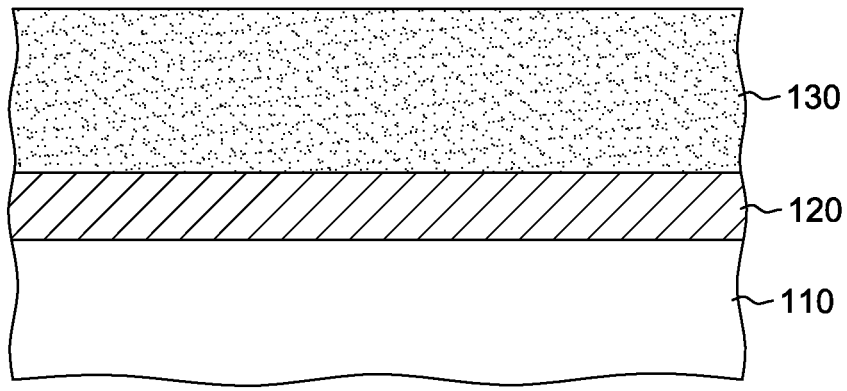
FIG. 1 depicts a cross sectional view of a semiconductor substrate upon which a fin structure may be fabricated, in accordance with an embodiment of the invention.

Embodiments of the present invention recognize that silicon-germanium (SiGe) fins may improve p-type field-effect transistor (FET) performance. Embodiments of the present invention recognize that SiGe has a critical thickness, such that only a certain number of heterolayers can be grown coherently on top of silicon before defects and misfit dislocations form to relieve the strain. For example, for 25% Ge SiGe, the critical thickness is about 30 nm. Embodiments of the present invention recognize that there is a need for SiGe fins capable of being formed at heights greater than the critical thickness of the SiGe composition of the fin. Further, embodiments of the present invention describe fabrication techniques to create a SiGe fin of uniform thickness and composition.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present invention will now be described in detail with reference to the Figures.

FIG. 1 depicts a cross sectional view of a semiconductor substrate upon which embodiments of the invention may be fabricated. The semiconductor substrate is, generally, a silicon on insulator (SOI) substrate comprising base layer 110, buried oxide layer (BOX) 120, and silicon layer 130. Base layer 110 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Base layer 110 may also be composed of other semiconductor materials, such as germanium, and compound semiconductor substrates, such as type III/V semiconductor substrates, e.g., GaAs. In embodiments of the present invention, silicon layer 130 is of a thickness equal to or greater than the desired height of the SiGe fin. For example, for a 10 nm node, a fin height of about 50 nm is desired.

In various embodiments, BOX 120 can be silicon oxide ($SiO_2$) that acts to insulate silicon layer 130 from base layer 110 (e.g., with a typical thickness of about 10 nm to about 500 nm). BOX 120 can be formed by thermally oxidizing the exposed surface of the substrate, or may be deposited onto base layer 110 using, for example, chemical vapor deposition (CVD) or atomic layer deposition (ALD). Silicon layer can be bonded to BOX 120.

Figure 2:
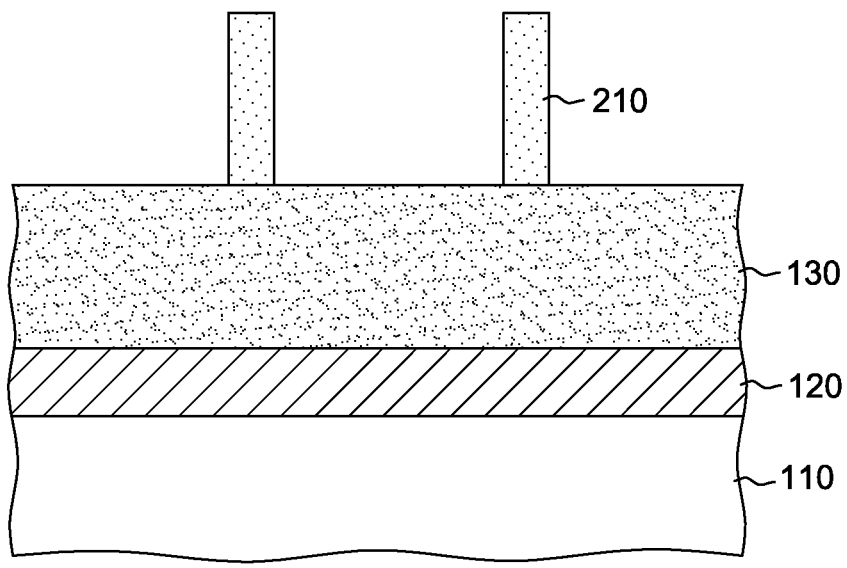
FIG. 2 illustrates deposition of a hard mask on the semiconductor substrate of FIG. 1, in accordance with an embodiment of the invention.

FIG. 2 depicts fabrication steps, in accordance with an embodiment of the present invention. FIG. 2 illustrates a process of deposition and patterning of hard mask layer 210 on top of silicon layer 130. Hard mask layer 210 is used to define areas of silicon layer 130 which are to become fins, as described in reference to the following Figures. In some embodiments, hard mask layer 210 is a nitride deposited using, for example, low pressure chemical vapor deposition (LPCVD). Hard mask layer 210 can be any hard mask material that can act as an etch mask during the patterning of the areas of silicon layer 130 which are to become fins. Other materials with which hard mask layer 210 may be formed include, but are not limited to, silicon nitride (SiN), hafnium oxide ($HfO_2$), or titanium oxide. In general, hard mask layer 210 is of a sufficient height to prevent the removal of portions of silicon layer 130 located underneath hard mask layer 210. In some embodiments, the width of each portion of hard mask layer 210 is equal to the width of the desired SiGe fins. In other embodiments, the width of each portion of hard mask layer 210 is of a thickness greater than the width of the desired SiGe fins.

Figure 3:
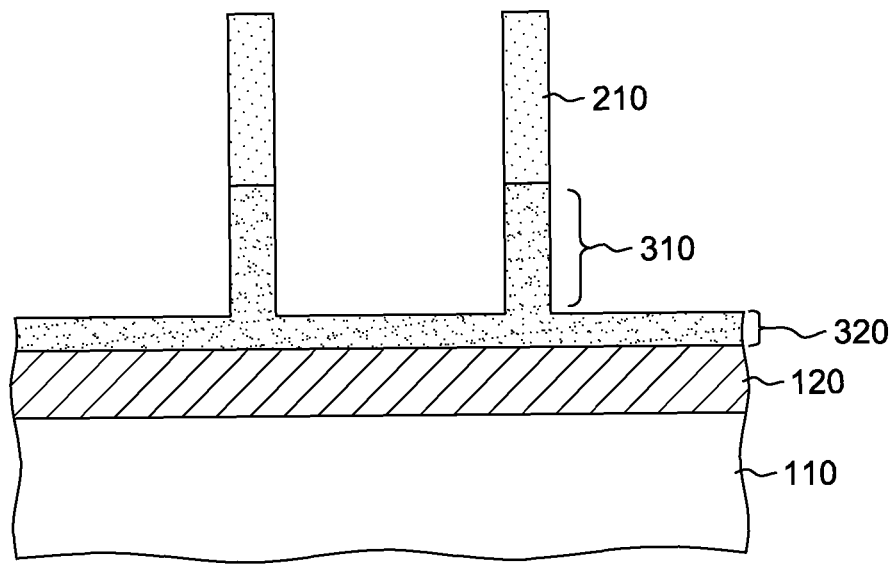
FIG. 3 depicts formation of silicon (Si) fins, in accordance with an embodiment of the invention.

FIG. 3 depicts additional fabrication steps, in accordance with an embodiment of the present invention. FIG. 3 illustrates a process of forming a plurality of silicon fins 310 by removing portions of silicon layer 130 not protected by hard mask layer 210. In embodiments of the present invention, upon removing the portions of silicon layer 130, thin silicon layer 320 remains. In some embodiments, the height of thin silicon layer 320 is within a range of 4 nm to 10 nm. In one embodiment, the height of thin silicon layer 320 is 5 nm. The portions of silicon layer 130 are removed using, for example, reactive-ion etching (RIE). RIE uses chemically reactive plasma, generated by an electromagnetic field, to remove various materials. A person of ordinary skill in the art would recognize the type of plasma used will depend on the material to be removed, or that other etch processes, e.g., wet chemical etch, laser ablation, etc., may be used.

Figure 4:
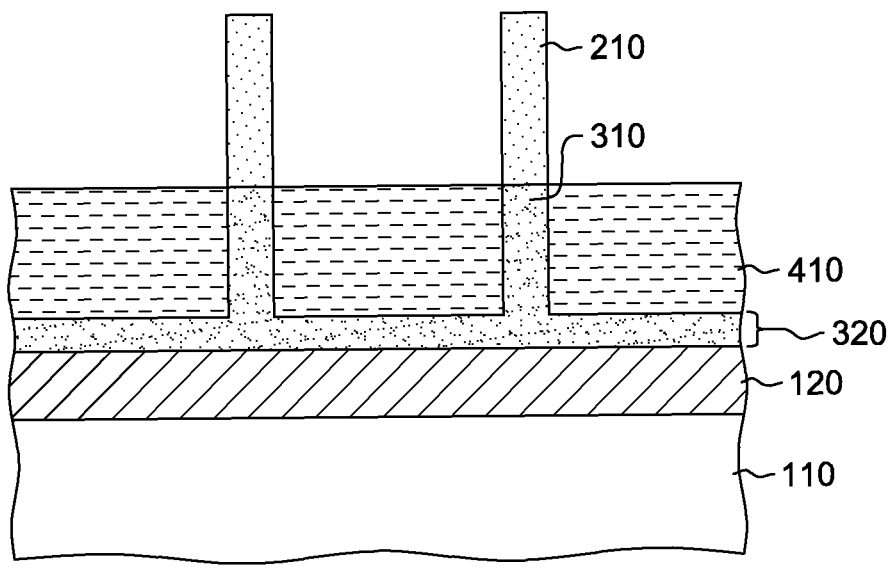
FIG. 4 depicts deposition of silicon-germanium (SiGe), in accordance with an embodiment of the invention.

FIG. 4 depicts additional fabrication steps, in accordance with an embodiment of the present invention. FIG. 4 illustrates a process of deposition of SiGe layer 410 upon thin silicon layer 320 and between silicon fins 310. In embodiments of the present invention, SiGe layer 410 is deposited via epitaxial growth. In one embodiment, SiGe layer 410 may be grown from exposed portions of silicon layer 130 (e.g., silicon fins 310, thin silicon layer 320). SiGe layer 410 may be grown using, for example, chemical vapor deposition (CVD). In some embodiments, SiGe layer 410 is grown such that the height of SiGe layer 410 exceeds, or passes, the height of silicon fin 310. In other embodiments, SiGe layer 410 is grown to a height equal to the height of silicon fin 310.

The presence of silicon fins 310 creates gaps upon thin silicon layer 320, defined by vertical portions of silicon fins 310. The existence of these gaps allows for the growth of defect-free SiGe of heights greater than merely growing SiGe on top of a silicon substrate. SiGe may be grown defect-free until reaching the critical volume for the particular composition of SiGe. In general, the smaller the distance between silicon fins 310 (e.g., between a first silicon fin and a second silicon fin), the higher SiGe can grow, while remaining free of defects.

Figure 5:
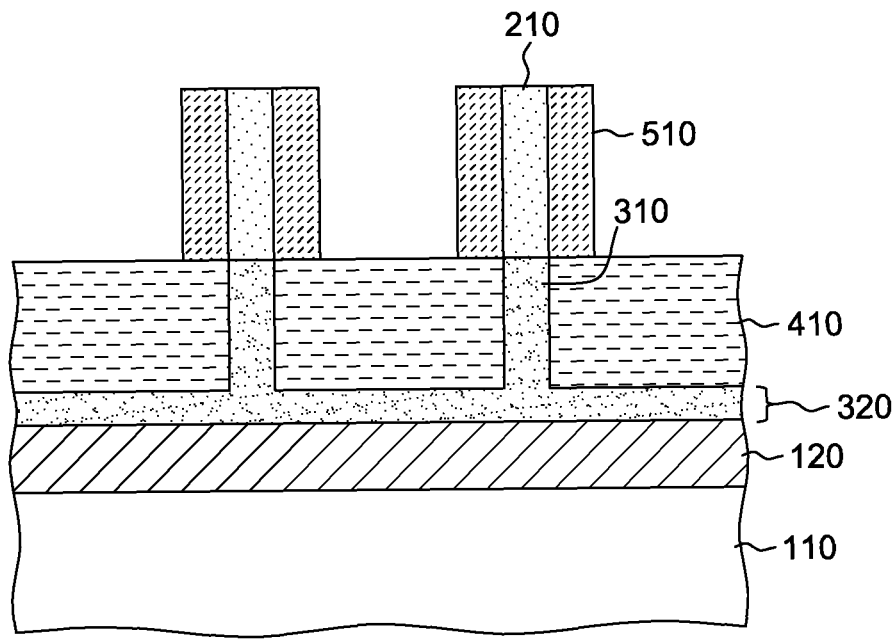
FIG. 5 depicts formation of a spacer on the sidewall of the hard mask of FIG. 2, in accordance with an embodiment of the invention.

FIG. 5 depicts additional fabrication steps, in accordance with an embodiment of the present invention. FIG. 5 illustrates a process of depositing spacer 510 on the sidewalls of hard mask layer 510. Spacer 510 is used to define areas of SiGe layer 410 and thin silicon layer 320 which are to be included as outer layers of SiGe/Si/SiGe fins. In some embodiments, spacer 510 is a nitride deposited using, for example, LPCVD. Other materials with which spacer 510 may be formed include, but are not limited to, SiN, $HfO_2$, or titanium oxide. In general, spacer 510 is of a sufficient height to prevent the removal of portions of SiGe layer 320 and thin silicon layer 320 located underneath spacer 510. In some embodiments, the width of each portion of spacer 510 is dependent upon the desired width of the SiGe fin. For example, the width of each portion of spacer 510 may be based on the amount of SiGe necessary for performance of the Ge condensation technique employed, as described with reference to FIG. 7. In general, the width of each portion of spacer 510 should allow for there to be enough SiGe (see FIG. 6) in each portion of SiGe layer 610 to allow for Ge condensation to drive Ge from SiGe layer 610 into silicon fin 310 and oxidize the silicon on the exposed surfaces of SiGe layer 310 and/or thin silicon layer 620.

Figure 6:
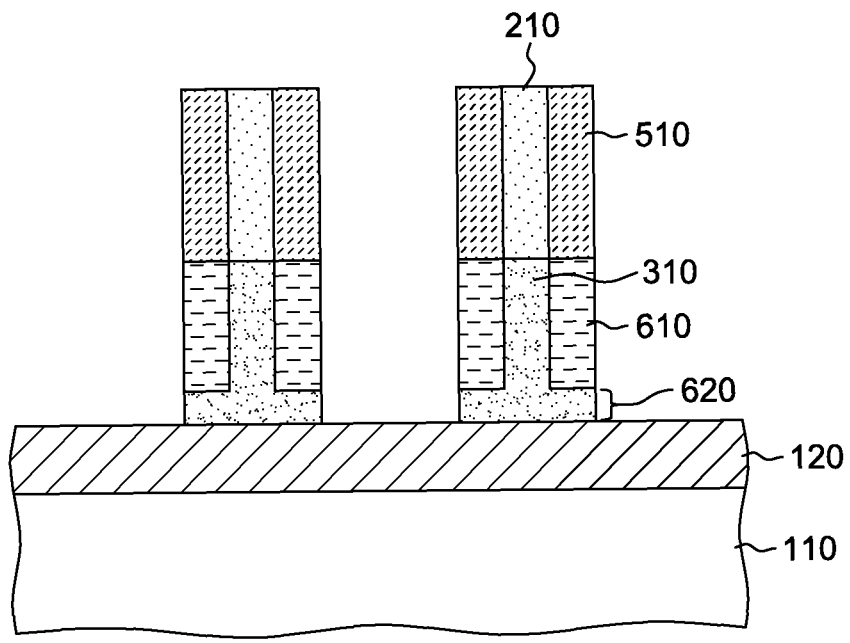
FIG. 6 depicts formation of SiGe/Si/SiGe fins, in accordance with an embodiment of the invention.

FIG. 6 depicts additional fabrication steps, in accordance with an embodiment of the present invention. FIG. 6 illustrates a process of forming a plurality of SiGe/Si/SiGe fins on top of thin silicon layer 620 by removing portions of SiGe layer 410 and thin silicon layer 320 not protected by hard mask layer 210 and/or spacer 510. Each fin includes silicon fin 310 in between SiGe layer 610, located on the sidewalls of silicon fin 310. In embodiments of the present invention, upon removing the portions of SiGe layer 410 and thin silicon layer 320, portions of BOX 120 are exposed. The portions of SiGe layer 410 and thin silicon layer 320 are removed using, for example, RIE. As previous described, RIE uses chemically reactive plasma, generated by an electromagnetic field, to remove various materials. A person of ordinary skill in the art would recognize the type of plasma used will depend on the materials to be removed, or that other etch processes, e.g., wet chemical etch, laser ablation, etc., may be used. As a result of the removal of the portions of SiGe layer 410 and thin silicon layer 320, SiGe layer 610 is formed uniformly on the sidewalls of silicon fin 310.

Figure 7:
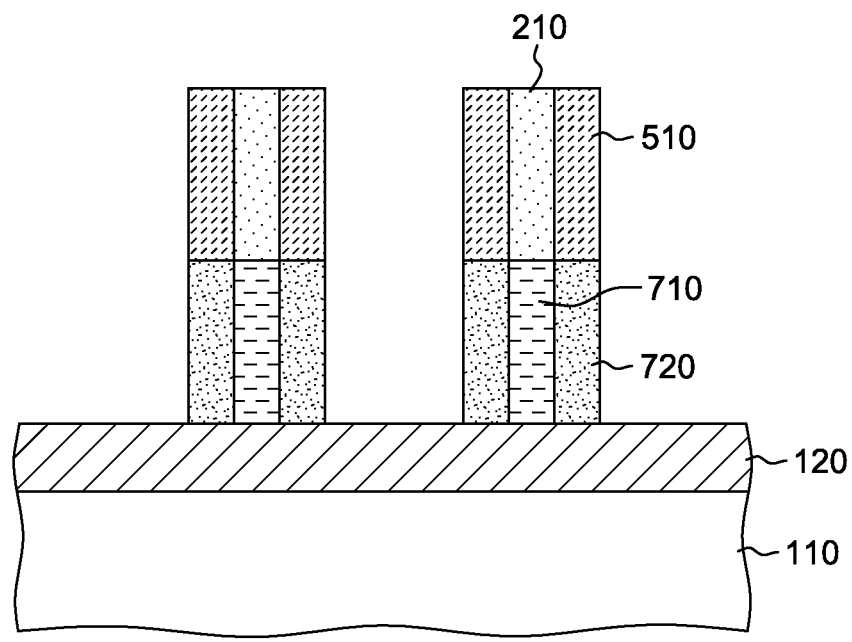
FIG. 7 illustrates a condensation process converting SiGe layers to oxide and Si layers to SiGe, in accordance with an embodiment of the invention.

FIG. 7 depicts additional fabrication steps, in accordance with an embodiment of the present invention. FIG. 7 illustrates a process of forming SiGe fin 710, surrounded by oxide layer 720, through a Ge condensation technique. In one embodiment, the structure is heated in an oxygen containing environment, including thin silicon layer 620, SiGe layer 610, and silicon fin 310, in an oven, furnace, or other device capable of applying heat to silicon layer 620, SiGe layer 610, and silicon fin 310. Heating, in an oxygen containing environment, thin silicon layer 620, SiGe layer 610, and silicon fin 310 oxidizes the Si in SiGe layer 610 and diffuses the Ge into underlying silicon fin 310 and the underlying portion of silicon layer 620. The Ge condensation process can be repeated until enough Ge is diffused to reach the desired concentration level of SiGe.

In one embodiment, the Ge condensation technique is a thermal oxidation process performed at a temperature sufficient to cause diffusion of Ge out of SiGe layer 610 (see FIG. 6) and into silicon fin 310. In one embodiment, the thermal condensation is performed within a temperature range of 700° C. to 1300° C. In another embodiment, the thermal condensation is performed within a temperature range of 1000° C. to 1200° C. In various embodiments of the present invention, thermal condensation is performed in an oxidizing ambient which includes at least one oxygen-containing gas. Oxygen-containing gases include, but are not limited to, $O_2$, NO, $N_2O$, ozone, and air. In some embodiments, oxygen-containing gases are admixed with one another (such as an admixture of $O_2$ and NO). In other embodiments, an oxygen-containing gas is diluted with an inert gas such as He, Ar, $N_2$, Xe, Kr, or Ne. The thermal condensation process described may be carried out for a variable period of time. In one embodiment, the thermal condensation process is carried out for a time period between 5 seconds and 5 hours, based on thermal oxidation temperature and oxidation species. In another embodiment, the thermal condensation process may be carried out for a time period between 5 minutes and 30 minutes. In various embodiments of the present invention, the thermal condensation process may be carried out at a single targeted temperature, or various ramp and soak cycles may be utilized using various ramp rates and soak times.

The result of the Ge condensation technique is depicted in FIG. 7. In some embodiments, SiGe fin 710 is comprised of defect-free SiGe at a desired concentration level and oxide layer 720 is an oxide (e.g., $SiO_2$). The Ge from SiGe layer 610 has been diffused into Si fin 310 and non-exposed portions of thin silicon layer 620 to create SiGe fin 710 and oxide layer 720. In various embodiments, oxide layer 720 can be of similar or different substances than BOX 120.

Figure 8:
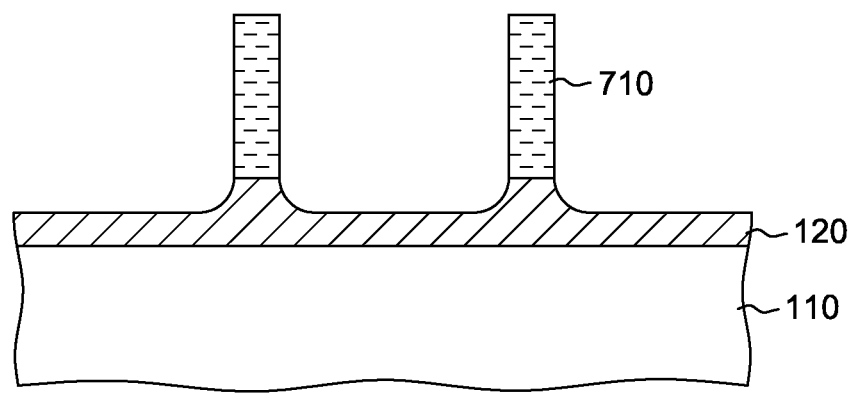
FIG. 8 illustrates removal of the oxide, spacer, and hard mask to expose a SiGe fin, in accordance with an embodiment of the invention.

FIG. 8 depicts additional fabrication steps, in accordance with an embodiment of the present invention. FIG. 8 illustrates a process of removing hard mask layer 210, spacer 510, and oxide layer 720. In one embodiment, hard mask layer 210, spacer 510, and oxide layer 720 are each removed. In some embodiments, exposed portions of BOX 120 are also partially removed. In general, any stripping technique known in the art may be used to remove hard mask layer 210, spacer 510, and oxide layer 720, in accordance with the materials that comprise hard mask layer 210, spacer 510, and oxide layer 720. Example stripping techniques may include, but are not limited to, wet stripping, dry stripping, or plasma stripping.

The resulting structure is one or more SiGe fins 710 that exceed the critical thickness (e.g., the maximum thickness SiGe could be deposited, defect-free, on a flat surface, such as Si) for the particular composition level of SiGe. In some embodiments, SiGe fin 710 is of a uniform thickness along the height of the fin, and is of a uniform composition of SiGe. The resulting SiGe fins 710 may be used, for example, to improve p-type FET performance.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a SiGe fin with a height above the critical thickness of SiGe and a process of manufacturing a SiGe fin with a height above the critical thickness of SiGe (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for fabricating a SiGe fin, the method comprising:
   providing a silicon on insulator (SOI) substrate, wherein the SOI substrate includes at least a silicon layer on top of a buried oxide layer (BOX);
   forming, using the silicon layer on top of the BOX, at least one fin upon a thin layer of silicon and a hard mask layer over the at least one fin;
   epitaxially growing a silicon germanium (SiGe) layer from exposed portions of the at least one fin and the thin layer of silicon;
   forming one or more spacers on one or more sidewalls of the hard mask layer;
   etching regions of the SiGe layer and the thin layer of silicon not protected by the one or more spacers, such that portions of the BOX are exposed;
   performing a condensation process to convert the at least one fin to SiGe and to convert the SiGe layer to an oxide layer; and removing the hard mask layer, the one or more spacers, and the oxide layer.

2. The method of claim 1, wherein forming, using the silicon layer on top of the BOX, the at least one fin upon the thin layer of silicon and the hard mask layer over the at least one fin comprises:
   patterning a hard mask layer over at least a portion of the silicon layer; and
   etching regions of the silicon layer not protected by the hard mask layer to form the at least one fin upon the thin layer of silicon.

3. The method of claim 1, wherein the silicon layer has a thickness of about 50 nm.

4. The method of claim 1, wherein the converted at least one fin is of a SiGe composition.

5. The method of claim 1, wherein the thin layer of silicon has a thickness greater than or equal to 4 nm and less than or equal to 10 nm.

6. The method of claim 1, wherein the thin layer of silicon has a thickness of about 5 nm.

7. The method of claim 1, wherein the hard mask layer is a nitride.

8. The method of claim 1, wherein the at least one fin upon the thin layer of silicon has a thickness greater than the thickness of the converted at least one fin.

9. The method of claim 1, wherein the converted at least one fin is of a uniform SiGe composition.

10. The method of claim 1, wherein the converted at least one fin has a uniform width along the height of the converted at least one fin.

11. The method of claim 1, wherein the condensation process to convert the at least one fin to SiGe and to convert the SiGe layer to oxide is a thermal oxidation process.

12. The method of claim 1, wherein the one or more spacers are each a nitride.

13. The method of claim 1, wherein epitaxially growing the SiGe layer from exposed portions of the at least one fin and the thin layer of silicon comprises:
   epitaxially growing the SiGe layer from the exposed portions of the at least one fin and the thin layer of silicon until the SiGe layer height exceeds the at least one fin height.

14. The method of claim 1, wherein epitaxially growing the SiGe layer from exposed portions of the at least one fin and the thin layer of silicon comprises:
   epitaxially growing the SiGe layer from the exposed portions of the at least one fin and the thin layer of silicon until the SiGe layer is about equal to the at least one fin height.

* * * * *